(12) United States Patent
Magnusen

(10) Patent No.: US 7,783,272 B2
(45) Date of Patent: Aug. 24, 2010

(54) DYNAMIC PERFORMANCE CONTROL OF BROADBAND TUNER

(75) Inventor: Timothy M. Magnusen, Murphy, TX (US)

(73) Assignee: Microtune (Texas), L.P., Plano, TX (US)

( * ) Notice: Subject to any disclaimer, the term of this patent is extended or adjusted under 35 U.S.C. 154(b) by 600 days.

(21) Appl. No.: 11/477,313

(22) Filed: Jun. 29, 2006

(65) Prior Publication Data
US 2008/0003966 A1 Jan. 3, 2008

(51) Int. Cl.
*H04B 1/06* (2006.01)
*H04N 5/14* (2006.01)

(52) U.S. Cl. .......... 455/232.1; 455/127.1; 455/251.1; 455/194.2; 455/341; 330/296

(58) Field of Classification Search ......... 455/232.1, 455/234.2, 245.1, 245.2, 247.1, 250.1, 251.1, 455/296, 303, 324, 343.1, 226.1, 226.2, 334, 455/340, 341, 574, 248.1, 241.1, 240.1, 522, 455/127.1, 194.2, 195.1, 311; 375/345, 346; 330/254, 282, 296; 348/707
See application file for complete search history.

(56) References Cited

U.S. PATENT DOCUMENTS

| | | | |
|---|---|---|---|
| 6,175,279 B1 * | 1/2001 | Ciccarelli et al. ........... | 330/296 |
| 6,625,238 B2 * | 9/2003 | Wieck ........................ | 375/349 |
| 6,646,510 B2 * | 11/2003 | Julien et al. ................. | 330/284 |
| 6,687,491 B2 * | 2/2004 | Wieck ........................ | 455/234.1 |
| 6,766,156 B1 * | 7/2004 | Hayashihara ................ | 455/295 |
| 6,781,467 B2 * | 8/2004 | Sun ............................ | 330/295 |
| 6,822,696 B2 | 11/2004 | Talmola et al. | |
| 6,856,796 B2 * | 2/2005 | Ding et al. .................. | 455/295 |
| 6,965,655 B1 | 11/2005 | Mostov et al. | |
| 7,079,825 B2 * | 7/2006 | Wieck ........................ | 455/234.1 |
| 7,095,994 B1 * | 8/2006 | Aytur et al. ................ | 455/234.1 |
| 7,245,890 B2 * | 7/2007 | Kumagawa et al. ......... | 455/130 |
| 7,292,104 B1 * | 11/2007 | Liwinski .................... | 330/283 |
| 7,408,411 B2 * | 8/2008 | Kim et al. .................. | 330/284 |
| 2003/0203725 A1 | 10/2003 | Cowley et al. | |

OTHER PUBLICATIONS

International Search Report and the Written Opinion issued for PCT/US2007/071435; Dated Jan. 7, 2008; 7 Pages.

* cited by examiner

*Primary Examiner*—Pablo N Tran
(74) *Attorney, Agent, or Firm*—Fulbright & Jaworski L.L.P.

(57) ABSTRACT

A broadband signal amplifier includes one of more broadband amplifier circuits, each dynamically controlled in response to a total power level of signals applied thereto to reduce linearity in response to a reduction of input signal strength. A filter may couple the output of the broadband amplifier circuits to each other to form a tandem arrangement. Power detectors are connected to detect and provide outputs indicative of the total power levels of the signals applied to respective broadband amplifiers. A control unit is connected to and receives the output from the power detectors and, in response, provides a control signals to the broadband amplifier circuit so as to operate each over portions of their operating characteristic curves that provide only that degree of linearity necessary to limit distortion to a predetermined or dynamically adjustable maximum acceptable level.

30 Claims, 3 Drawing Sheets

DYNAMIC PERFORMANCE CONTROL OF BROADBAND TUNER

CROSS-REFERENCE TO RELATED APPLICATIONS

The presented application is related to and incorporates by reference herein in their entireties the disclosures of U.S. patent application Ser. No. 11/376,745 filed Mar. 15, 2006 and entitled Broadband Integrated Tuner; U.S. patent application Ser. No. 08/426,080 filed Apr. 21, 1995, now U.S. Pat. No. 5,737,035 and entitled Highly Integrated Television Tuner on a Single Microcircuit; U.S. patent application Ser. No. 08/904,908 filed Aug. 1, 1997, now U.S. Pat. No. 6,177,964 and entitled Broadband Integrated Television Tuner; and U.S. patent application Ser. No. 09/572,393 filed May 16, 2000 and entitled Broadband Integrated Tuner.

TECHNICAL FIELD

The invention generally relates to broadband amplifiers and more particularly to dynamic control broadband amplifier circuitry to accommodate variations in a total power level of the applied signals so as to operate the amplifier circuitry over a portion of its operating curve appropriately linear for such total power levels.

BACKGROUND OF THE INVENTION

Broadband amplifiers such as those used for radio frequency (RF) circuits are specified and designed to satisfy various criteria, primary among those are noise, distortion and gain. While every circuit adds some amount of noise and distortion to a signal, proper operation of a device often demands that these effects be limited to some acceptable level. Accordingly, designers specify an acceptable level of noise and distortion that the overall circuit can tolerate such that device operation is not degraded beyond some desired threshold level.

Signal distortion for broadband circuits such as broadband amplifiers is a function of and proportional to the overall total input signal level required to be accepted by a particular circuit; the greater the total overall input signal the greater will be the distortion level while operating at a particular point of the amplifier's operating curve. This becomes critical in circuits designed to accommodate a relatively broad frequency of input signals made up of, for example, a plurality of discrete carrier signals such as typically carried by a cable television or an off-the-air antenna system. Within the required bandpass of devices used by such systems (e.g., input or "RF" stage of a television receiver), a large number of receivable discrete carrier signals may be present spanning a range of signal strengths, i.e., some signals may be relatively weak and others quite strong, the latter possibly exceeding the maximum signal level handling capabilities of the input stage over which a desired degree of linearity may be achieved. That is, excessive total input signal power may result in exceeding the maximum dynamic range of the amplifier circuit over which an input-to-output transformation is substantially linear. A result of operating outside an acceptable linear portion of the amplifier circuit's operating curve is that excessive distortion may be introduced into the resultant output signal. While a particular device may ultimately select and cull from among many signals of a broadband signal a single signal for further processing, preceding broadband amplifier circuits must accommodate many adjacent signals constituting the broadband signal and having a total power that may be much greater than that of a single or some relatively small number of desired signal(s). To avoid introducing excessive distortion, these broadband amplifiers should be operated over an appropriate portion of their operating curves based on a worst case highest anticipated total signal power level rather than just that of the embedded desired signal(s). That is, the greater the total applied signal power, the more difficult it is to maintain input-to-output linearity necessary to achieve a desired maximum signal distortion level.

These broadband amplifiers must be operated along an appropriate portion of their operating curves for the total signal power level to be handled. In spite of large dynamic ranges of signal levels among the various channels, the system must provide for and accommodate the reception and detection of the weakest signals found among what may be many strong signals. These extraneous, non-selected signals may be termed "non-desired."

In such an environment, certain assumptions must be made when specifying circuit design and operational criteria. Typical design practice takes the approach of accommodating the "worst case" situation under which a particular device is required to operate with a given performance criteria. Thus, for example, circuit design must provide a sufficiently low noise figure to accommodate the weakest signal level to be received but, at the same time, a distortion performance that will accommodate a high power level resulting from a large number of signals present at the input. For example, in a typical cable television system including 133 channels of programming transmitted on respective carrier signals, certain tuner arrangements may include some form of tracking filter that is dynamically adjusted to, partially or substantially, eliminate signals other than a selected signal or signals. However, in the absence of such a tracking filter (such as in tuners integrated on a single integrated microchip), the input circuitry must avoid signal distortion based on the summed power of all 133 channels even though all but one channel is to be rejected at some later (e.g., intermediate frequency or "IF") stage. That is, the "non-desired" 132 channels contribute additional power to the input such that an input amplifier stage must be much more linear than if it needed to be designed to merely accommodate the power of the single selected channel/carrier signal.

Using standard circuit design criteria and methodology, all circuits are designed based on the maximum allowable noise figure that can still provide a suitable signal-to-noise ratio to provide specified signal processing for some minimum signal strength while, at the same time, these circuits must provide a threshold distortion capability in excess of the total power that might be presented in a worst case scenario of all channels having some maximum signal strength. While present at the input stage, some of the non-desired channel signals are removed at later, intermediate stages (e.g., IF) by appropriate filtering used to reject non-selected signals that thereby reduces the total power of the combined, IF signal. That is, intermediate bandpass filtering removes some of this power of the undesired signals while leaving the desired signal power substantially the same. Unfortunately, in a broadband system it is often difficult, if not impossible, to predict or have sufficient information about these "undesireds", i.e., the non-selected signals, to determine an appropriate "over-design" margin. Absent this information, devices not having a tracking filter to reduce the power level of non-selected signals, design criteria is statically dictated by a possibly transient worst case total signal power situation.

BRIEF SUMMARY OF THE INVENTION

The present invention is directed to systems and methods employing dynamic control of one or more broadband amplifier circuits to adjust an operating point so that amplifier linearity tracks total signal input power, i.e., linearity increases with a detected increase in total signal input power over frequencies within the input bandpass of the amplifier, and decreases as total signal input power decreases. Embodiments of the present invention further includes RF input circuits, television tuners, and similar broadband circuits and devices incorporating dynamically controlled circuitry as described. Broadband may include a bandwidth including a wide range of frequencies capable of carrying multiple signals (or channels) by dividing the total capacity of the amplifier, circuit or medium into multiple, independent bandwidth channels, where each channel operates only on a specific range of frequencies. For example, an input tuner circuit for a television may accommodate 133-6 MHz wide channels in the frequency range of 50-870 MHz. A broadband amplifier to be included as part of such input tuner circuit should be capable of operating over this expansive frequency range of 830 MHz.

According to one aspect of embodiments of the invention, a circuit for controlling an operation of a broadband amplifier circuit includes a power detector and a control unit. The power detector power detector may be connected to provide an output indicative of a total signal power level of an input signal applied to the broadband amplifier circuit. The control unit receives the output from the power detector and, in response, provides a control signal to the broadband amplifier circuit. The control signal functions to adjust a performance attribute of the broadband amplifier circuit to dynamically maintain, without substantially exceeding, minimum allowable performance criteria such as minimum acceptable linearity or maximum allowable overall distortion.

According to a feature of embodiments of the invention, the control signal operates to cause the linearity of the broadband amplifier circuit to vary in direct relationship to said total signal power level of said input signal, i.e., causes overall amplifier linearity to increase in response to detection of an increase in total signal power level applied to the broadband amplifier. Similarly, the control signal may operate to cause an overall distortion of the broadband amplifier circuit to vary in inverse relationship to the total signal power level of said input signal, i.e., increase with a decrease in total signal power level applied.

According to another aspect of embodiments of the invention, one or more broadband amplifier circuits may be dynamically controlled by a control unit in response to total signal power level(s) applied to the amplifier circuit(s) so as to dynamically maintain, without substantially exceeding, minimum allowable performance criteria for each amplifier circuit, such as a minimum acceptable linearity or maximum allowable overall distortion parameter.

According to another aspect of embodiments of the invention, a television tuner may incorporate an input circuit that dynamically adjusts to a total signal power level applied to provide a minimum acceptable level of performance without substantially exceeding performance requirements and thereby reduce power consumption.

According to another aspect of embodiments of the invention, a method of controlling an operation of a broadband amplifier circuit may include detecting a total signal power level of an input signal applied to the broadband amplifier circuit; and adjusting a performance attribute of the broadband amplifier circuit in response to the total signal power level so as to dynamically maintain, without substantially exceeding, minimum allowable performance criteria.

As described in connection with the various aspects and features of the invention, embodiments of the invention dynamically adjust circuit parameters in response to input signal conditions to maintain some minimal acceptable circuit performance while providing for reduced circuit power consumption when appropriate. Rather than statically accommodate some worst case total input signal power level due to the presence of spurious signals (such as undesireds), embodiments of the invention include total power monitoring circuits that dynamically adjust circuit parameters to maintain the minimum linearity necessary to limit signal distortion to an acceptable level. These parameters may include a quiescent or operating point along an operating or load curve of the amplifier such that substantially all operation of the amplifier is contained within a suitably linear portion of the operating curve based on the instantaneous or average total signal power level presently being applied. For example, linearity and thereby signal distortion may be controlled by dynamically adjusting bias levels of the input amplifier circuits including, for example, a bias voltage or current applied to a transistor so as to minimize power consumption consistent with obtaining a desired linearity or tolerating a maximum acceptable level of distortion. Monitoring total signal power levels and, in response, appropriately adjusting amplifier bias levels or other parameters to achieve only that linearity required to limit signal distortion to an acceptable level results in consistent and uniform chip operation over a wide variety of input signal conditions while minimizing power consumption.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
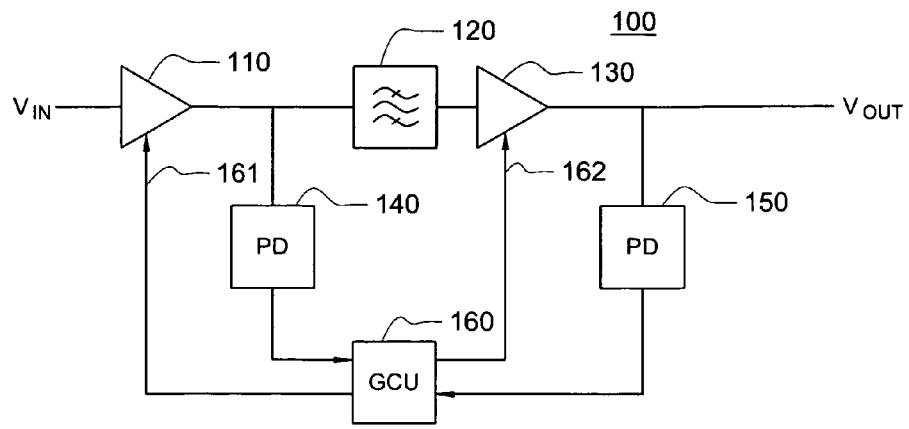
FIG. 1 is a schematic circuit diagram of a broadband input stage according to an embodiment of the invention.

FIG. 1 is a schematic circuit diagram of a broadband Input Stage 100 according to an embodiment of the invention. Input Stage 100 includes one or broadband amplifier circuits and total power detectors (for purposes of the present illustration, two of each are shown and described herein although other numbers and arrangements of broadband amplifier circuits and corresponding power detectors are possible). Each of the broadband amplifier circuits is controlled by adjusting a parameter thereof in response to the total signal power level applied at an input of the amplifier as sensed by the corresponding power detector. In the present example, the parameter being adjusted in a quiescent or operating point of constituent transistors by appropriate adjustment of a bias voltage or current applied thereto. The quiescent or operating point is set in response to the detected (e.g., instantaneous, averaged, or other) total signal power such that the respective transistors are caused to operate over appropriately linear portions of their operating curves for such detected total signal power so as to limit overall signal distortion to some predetermined maximum acceptable value. Although these amplifiers may further incorporate gain control, embodiments of the present invention include dynamic adjustment of some parameter so as to maintain a degree of linearity appropriate to the total input power applied.

Referring to FIG. 1, First Broadband Amplifier Circuit 110 receives an input signal $V_{in}$ and amplifies the signal in response to a First Control Signal 161 provided by Gain Control Unit (GCU) 160. GCU 160 may be implemented in a variety of forms so as to translate the total signal power sensed by Power Detector (PD) 140 into an appropriate Control Signal 161. That is, GCU 160 provides Control Signal 161 so as to adjust an operating point of First Broadband Amplifier 110 such that it operates over a linear portion of its operating curve appropriate to the total signal power level applied to the amplifier. These implementation may be in the form of discrete analog circuits (e.g., a DC operational amplifier or "op amp"), an ASIC (application-specific integrated circuit), a processor running under control of appropriate software, etc. For example, Control Signal 161 may be used to regulate a bias of First Broadband Amplifier Circuit 110, e.g., control a DC biasing voltage or current used to establish the DC operating point or quiescent point (also called Q-point) of the amplifier/transistor. This is accomplished so as achieve a desired amplification without exceeding an acceptable distortion level based on the total power level detected by PD 140. In addition to translating total signal operating power into a control signal appropriate to the parameter and device being controlled (e.g., a specific transistor constituting an active element of First Broadband Amplifier Circuit 110), GCU 160 may include appropriate processing to account for signal amplification provided by First Broadband Amplifier Circuit 110. The overall translation may be effectuated by appropriate analog parameters, as a program for computing the appropriate control signals, in the form of a look-up-table, or otherwise. In the present example, GCU 160 is responsive to the total signal power for selecting an appropriate operating point bias level to limit amplifier signal distortion to some acceptable level (i.e., operate at an appropriate portion of the amplifier's operating or transfer curve or transfer function) and, at the same time, minimize amplifier power consumption. Power consumption is minimized since keeping an amplifier operating linearly consumes significant power which, if not dynamically controlled, must be preset to accommodate a worst case, maximum total signal power that may be applied to the amplifier. Dynamic control moves the quiescent or operating point to operate the amplifier at a reduced power consumption level in response to a reduced total signal power level and a corresponding reduction in linearity requirements.

The amplified signal from First Broadband Amplifier Circuit 110 is supplied to Bandpass Filter 120 that operates to remove or suppress any or some "undesireds" at frequencies sufficiently removed from that of the desired signal(s) so as to be attenuated by some amount or to a designed maximum signal level, this depending upon filter design (e.g., permissible center frequency insertion loss, bandwidth, Q, etc.). According to one preferred embodiment of the invention, Bandpass Filter 120 passes several (e.g., four) standard 6 MHz television channels while blocking or substantially attenuating RF signals of channels further removed from a central pass frequency of the filter (e.g., the remaining channels, 129 in the present 133 total channel example.) The filtered output from Bandpass Filter 120 is connected to the input of Second Broadband Amplifier Circuit 130. The amplified output from Second Broadband Amplifier Circuit 130 is supplied both as an output $V_{out}$ to a next device or stage (e.g., converter, detector, demodulator, etc) and to PD 150. An output from PD 150 supplies a power signal to GCU 160 indicative of the total power output from Second Broadband Amplifier Circuit 130 and thereby also representative of the total power at the input of the amplifier by accounting for the power increase produced by (i.e., gain of) the amplifier circuit. Although embodiments of the present invention are directed toward adjusting amplifier parameters that do not appreciably (if at all) affect amplifier gain, any changes to amplifier gain may be considered in determining the total power at the input. It is further possible to derive an appropriate translation from total signal power sensed by a power detector to a corresponding control signal provided by GCU 160 to a corresponding broadband amplifier circuit using empirical or other methods to derive an appropriate function. Such function may be implemented in hardware and/or software (including in the form of a look-up-table) wherein several constants (e.g., power detector sensitivity, amplifier gain, etc.) are embodied as a single combined constant or variable.

In response to total signal power detected by PD 150, GCU 160 supplies a Second Control Signal 162 to Second Broadband Amplifier Circuit 130 to regulate an operating parameter thereof which may be the same as or different from that discussed in connection with First Broadband Amplifier Circuit 110. For example, according to a preferred embodiment of the invention, Second Control Signal 162 may set a DC biasing point of Second Broadband Amplifier Circuit 130 to achieve a desired degree of linearity appropriate to the total power level of the signal applied to or output by Second Broadband Amplifier Circuit 130.

GCU 160 may be implemented as a decision-making block including hardware and/or software for appropriately setting operating (e.g., biasing) points of one or more signal amplifiers. Each signal amplifier (two are shown, i.e., First and Second Broadband Amplifier Circuits 110 and 130, although other numbers may be used and/or controlled according to various embodiments of the invention) is designed in consideration of the amount of noise that it adds and the total signal power presented at an input of the amplifier.

In one embodiment of the invention used to amplify a broadband cable television signal, the total power is a function of both the average power of an individual television carrier signal and the number of channels constituting the composite cable television signal. As previously described, in addition to a desired channel (e.g., a channel that is selected for reception), there are commonly a large number of undesired channels present in the composite signal, each of which may be the same as or possibly greater power level than the desired channel. GCU 160 then measures the total power coming from the amplifier as detected by PD 140 and, in response, determines if the total signal power is a worst case, i.e., some maximum. If the total power is less than the maximum design level, GCU 160 operates to reduce the performance of the amplifier by causing the amplifier to operate at a point along its operating curve or transfer function (e.g., along the DC load line of an individual transistor) that provides an appropriate degree of linearity for the total signal input power and thereby appropriately reduces the performance and power consumption of the amplifier. That is, the operating point of the amplifier circuit may be dynamically adjusted in response to changing total signal input power to achieve and maintain a total distortion figure for the circuit that satisfies but does not substantially exceed the design requirements. By not substantially exceeding design requirement by unnecessarily reducing distortion below some acceptable level, less power is wasted than if the amplifier circuit was continuously operated within an extended linear portion of its operating curve necessary to accommodate a worst case (e.g., maximum) total signal power level.

Note that varying the operating point does not change the DC gain of the amplifier, only the performance as it is related to distortion. This minimized internal power consumption of the amplifier reduces overall power consumption and minimizes power dissipation of the amplifier in the form of heat. The net effect is also to maintain the effective signal-to-noise and signal-to-distortion ratios constant, that is, embodiments of the invention do not allow the signal-to-noise or signal-to-distortion to exceed that which is actually required to meet design specifications, e.g., for the proper operation of subsequent circuitry or devices.

Although a preferred embodiment of the invention monitors total power at the output of an amplifier to be controlled, such total power monitoring may be accomplished at the input or otherwise so as to characterize the overall total power of the input signal. That is, one method of monitoring total signal power at the input of an amplifier is to place a power detector at the output and subtract the gain of the amplifier, in the present example, that of either amplifier 110 or amplifier 130. This method is preferable in that the detector need not be as sensitive as if placed at the input and in that less noise is introduced into the measurement process. In response, GCU 160 controls the amount of current that is supplied to or adjusts some other parameter of the monitored amplifier so as to maintain its overall distortion performance constant. The result is to keep the carrier-to-noise and carrier distortion of the output ($V_{out}$ in present example) a constant over a broad range of input signal conditions. This has the further effect that, for large values of undesired power present, the power consumption and thereby the power dissipation of the chip will increase up to its worst case condition to be able to meet the carrier-to-noise and carrier-to-distortion specifications of related equipment such as a television tuner. While carrier-to-noise, the relations between the desired signal and random noise, is generally and/or substantially unaffected by embodiments according to the present invention, carrier-to-distortion, the relation between the desired signal and amplifier circuit (e.g., tuner) created undesired signals, figures may vary. Thus, the larger the total detected signal power (absent changes to the operation of the amplifier including overall device operation such as a tuner incorporating the amplifier) the smaller will be the carrier-to-distortion ratio. However, if the total detected signal power increases while amplifier power is allowed to increase (together with amplifier or tuner power dissipation) then the carrier-to-distortion ration remains constant.

As the total power level decreases as a result of a reduction on the power levels of undesired signals (i.e., operating conditions recede from the worst case), the output signal-to-noise and signal-to-distortion remain constant, but the amount of power dissipation, the amount of current that the chip uses, and therefore the power dissipation, are all reduced.

Another feature of embodiments of the invention accommodate signal variations resulting from signal processing such as signal filtering performed by, in the present illustration and example, Bandpass Filter 120. Although PD 140 is connected and operates to sample the total output power of First Broadband Amplifier Circuit 110, this sampling point does not provide total power information about the total input power at Second Broadband Amplifier Circuit 130 because the signal level at this point has gone through and been processed by Bandpass Filter 120. That is, each time the signal goes through a filter, information from prior measurements is no longer valid concerning the undesired ratio i.e., information about total power of the desired and undesired signals and a ratio therebetween must be determined anew. This is because the ratio of the undesired to desired signal levels is not predictable If the undesired signal power is changed, e.g., due to the action of a device such as Bandpass Filter 120, then the total signal power measurement (i.e., the sum of the desired and undesired signals) must be repeated.

Therefore, the present embodiment accommodates a two-stage amplifier circuit according to the present example by including a second PD 150 at the output of Second Broadband Amplifier Circuit 130 indicative of the total signal power applied at the input of that amplifier.

Figure 2:
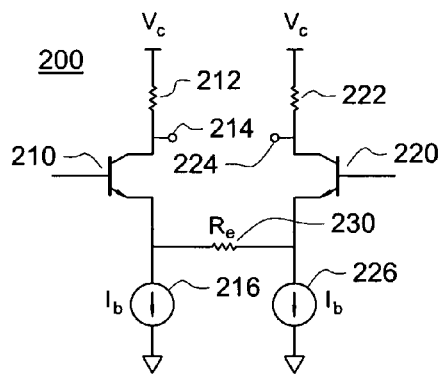
FIG. 2 is a schematic circuit diagram of a differential amplifier circuit employed by a preferred embodiment of the invention.

FIG. 2 is a schematic circuit diagram of a Differential Amplifier 200 according to an embodiment of the invention as may be used for First and/or Second Amplifier Circuits 110, 130. An input signal that is to be amplified is simultaneously applied in opposing phases to the bases of Bipolar Junction (or, simply, "Bipolar") Transistors 210 and 220. The collectors of each Bipolar Transistor 210 and 220 are connected through respective Load Resistors 212 and 222 to some power source $V_c$. An amplified output signal is supplied at Output Terminals 214 and 224 connected to respective collectors of Bipolar Transistors 210 and 220 and may be connected to a subsequent circuit or device.

The emitters of Bipolar Transistors 210 and 220 are connected to opposite terminals of an Emitter Degeneration Resistor 230 and to respective Current Sources 216 and 226. In turn, Current Sources 216 and 226 are connected to ground or some other reference voltage or potential.

Operationally, Emitter Degenerative Resistor 230 may represent a significant contributor to circuit noise such that it is undesirable to adjust its value. However, Current Sources 216 and 226 are subject to adjustment to provide an appropriate DC bias for respective Bipolar Transistors 210 and 220 to operate each along a suitably linear portion of their respective DC load lines. That is, the bias current supplied by Current Sources 216 and 226 should preferably accommodate the maximum total voltage or power value of the signal to be amplified and still provide for operation along suitably linear portion of the transistor's load curve. If the total input signal power increases then the bias currents supplied by Current Sources 216 and 226 may be increased while, if the signal level input to the amplifier decreases, GCU 160 may decrease the bias currents such that, while the distortion performance of the amplifier would be degraded in absolute terms, the distortion performance of the resultant output signal would remain constant. At the same time, the signal-to-noise performance and overall gain of the amplifier remains constant because the value of Emitter Degenerative Resistor 230 is held constant.

Figure 3:
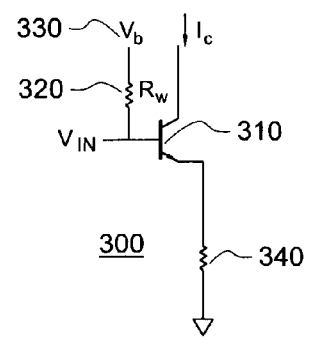
FIG. 3 is a schematic circuit diagram of a single-ended amplifier circuit employed by another preferred embodiment of the invention.

FIG. 3 depicts another example of an amplifier circuit appropriate to various embodiments of the present invention. Single-Ended Amplifier 300 includes Bipolar Transistor 310 having a collector connected to receive a current $I_c$ and an emitter connect through an Emitter Resistor 340 to ground. A bias voltage $V_b$ is applied through Bias Resistor 320 to the base of Bipolar Transistor 310 along with the input signal $V_{in}$ to be amplified. An output signal may be derived from several locations including by a suitable connection to the collector or emitter, the current $I_c$ representing the amplified output signal. Thus, since the voltage level of the input signal $V_{in}$ is reflected by a varying current at the output in the form of $I_c$, Amplifier 300 functions as a transconductance amplifier. Note that, although the present example includes a Bipolar Transistor 310, other forms of transistors may be used including, for example, FETs, MOSFETS, etc. by suitable modification of the circuitry.

The bias of Amplifier 300, i.e., the DC operating point along the DC load line of Bipolar Transistor 310 is set by the value of Bias Resistor 320 and of bias voltage ($V_b$) 330. That is, $V_b$ 330 determines the current level flowing through Bipolar Transistor 310 and Emitter Resistor 340. Appropriate control of Bias Voltage $V_b$ 330 provides for dynamic control of Amplifier 300 to accommodate a wide range of total signal input power levels while adapting to reduced total signal power levels so as to reduce power consumption. In the worst case scenario of a great number of relatively strong (i.e., high power) undesired signals, bias voltage $V_b$ would be set (e.g., by GCU 160) to a level such that the current through bipolar transistor 310 and emitter resistor 340 would be at some maximum value. As the input signal levels decrease and move away from the worst case situation, bias voltage $V_b$ may be decreased (e.g., under the control of or by GCU 160) so as to effectively lower the voltage drop across Emitter Resistor 340. In response the bias current flowing through Emitter Resistor 340 and Bipolar Transistor 320 would be reduced producing a corresponding reduction in power consumption and heat generation. That is, instead of adjusting the bias current, the bias voltage is adjusted to produce a corresponding change in the bias current of the amplifier itself. As previously described, since the value of Emitter Resistor 340 is not changed, the noise performance of the amplifier remains constant; only the distortion performance is reduced.

Figure 4:
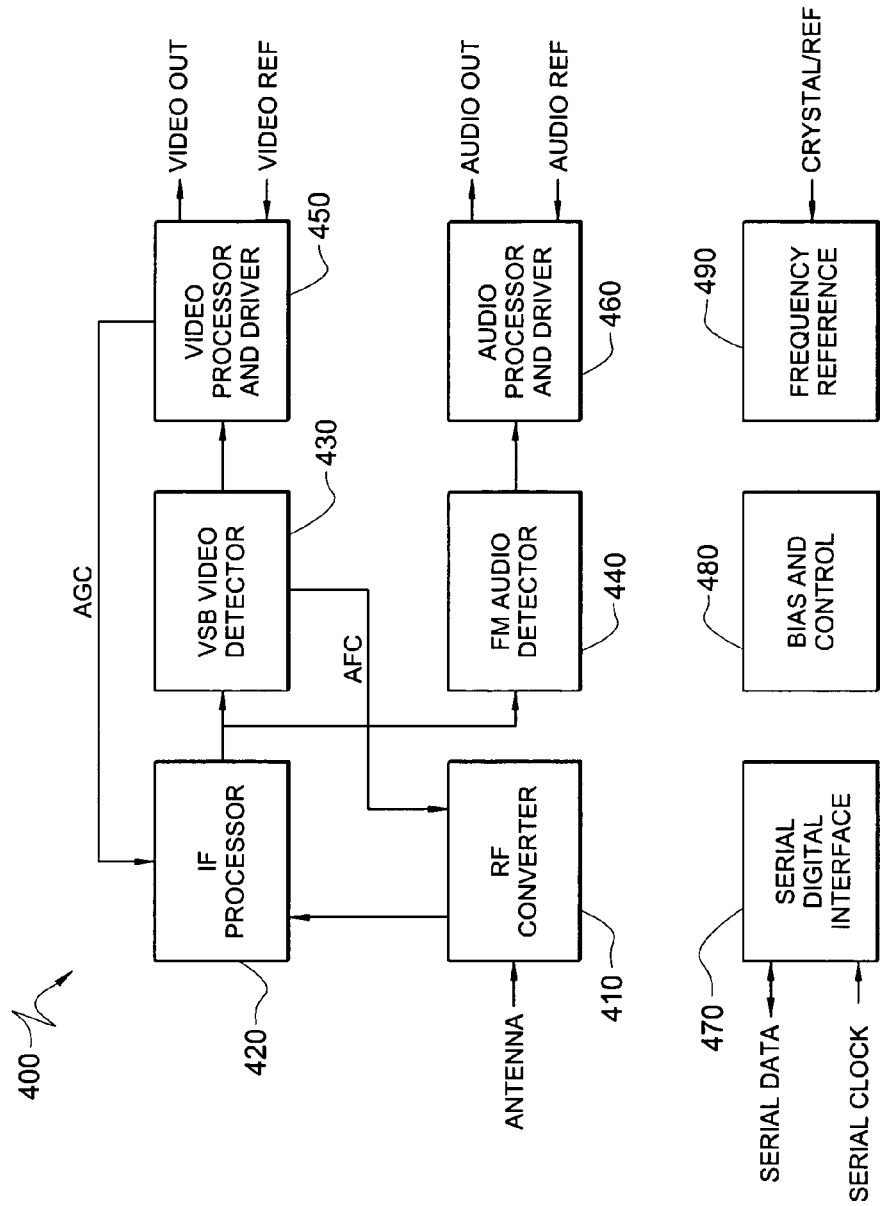
FIG. 4 is a high level block diagram of functional elements contained in a preferred embodiment of a TV tuner including a dynamically controlled broadband amplifier according to a preferred embodiment of the present invention.

FIG. 4 depicts a high-level block diagram of functional elements contained in a preferred embodiment of TV tuner 400 including a dynamically controlled amplifier as above described. Although a specific tuner architecture is given in the present example, amplifiers according to embodiments of the present invention may be employed in a wide range of applications beyond the illustrative TV tuner and/or television receiver herein described. A further description of TV tuner 400 may be found in U.S. Pat. No. 5,737,035 issued Apr. 7, 1998, entitled "Highly integrated television tuner on a single microcircuit" (the "'035 Patent") and incorporated herein in its entirety by reference.

Figure 5:
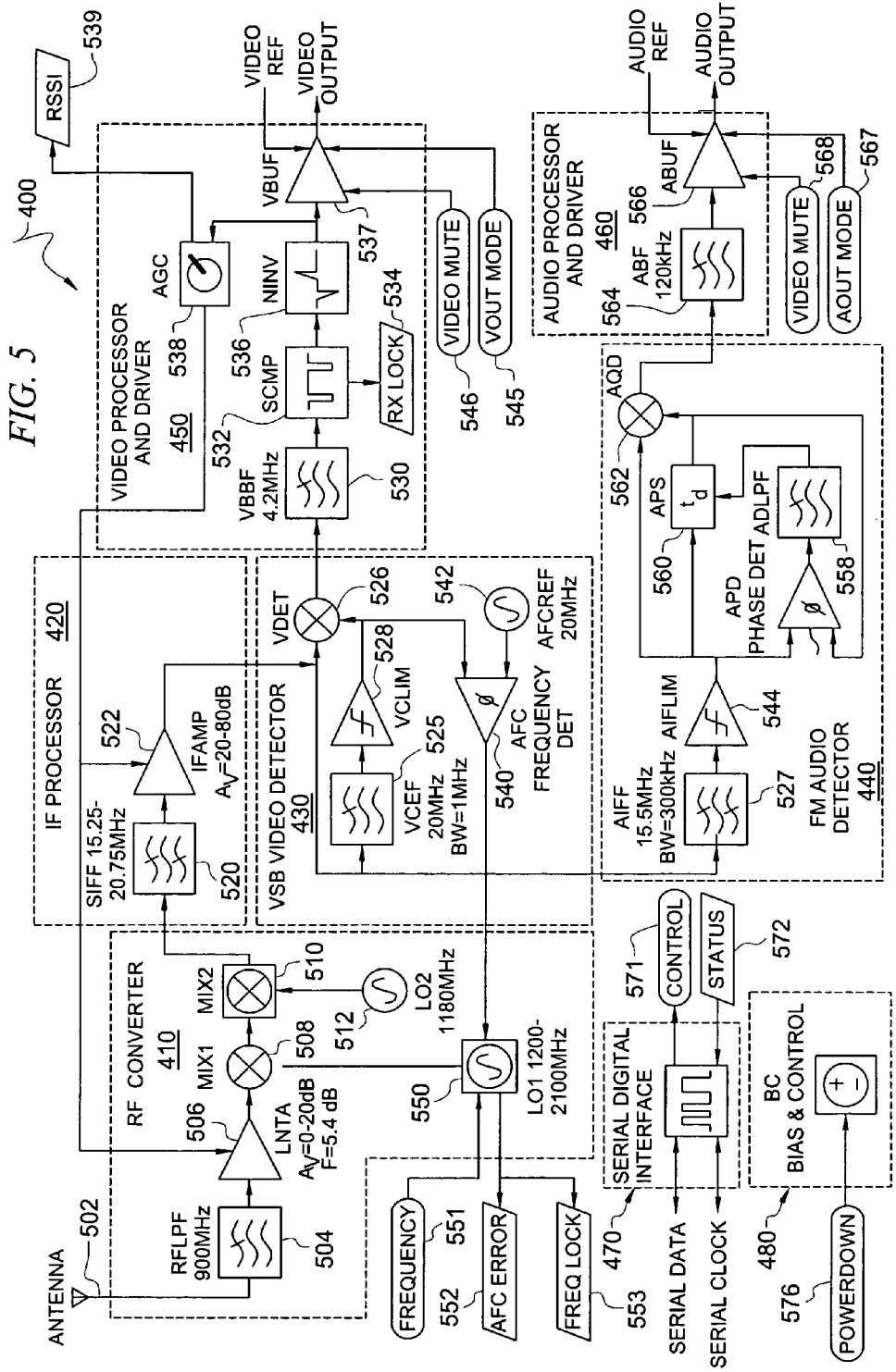
FIG. 5 is a detailed electrical block diagram of TV tuner including a dynamically controlled broadband amplifier according to a preferred embodiment of the present invention.

FIG. 5 is a detailed electrical block diagram of TV tuner 400 as described in the '035 Patent but including an RF Converter Stage 410 incorporating a Dynamically Controlled Amplifier 506 according to a preferred embodiment of the present invention. Thus, a filtered RF signal is amplified up to 20 dB by Dynamically Controlled Amplifier 506 in the form of Input Stage 100 (FIG. 1). As previously described in connection with FIGS. 1-3, the linearity of Dynamically Controlled Amplifier 506 is responsive to the total input power of the spectrum of signals each stage of the amplifier is to amplify such that linearity automatically increases and decreases with corresponding changes in the total power of such signals while signal-to-noise attributes and gain of the amplifier and constituent amplifier stages remains substantially constant.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit for controlling an operation of a broadband amplifier circuit, comprising:

a power detector connected to provide an output indicative of a total signal power level of an input signal applied to the broadband amplifier circuit; and a control unit receiving said output from said power detector and, in response, providing a control signal to the broadband amplifier circuit, said control signal adjusting a performance attribute of said broadband amplifier circuit to dynamically maintain, without substantially exceeding, minimum allowable performance criteria;

wherein said output indicative of a total signal power level of an input signal is derived by measuring the output signal from said amplifier circuit and subtracting a gain factor of said amplifier circuit.

2. The circuit according to claim 1 wherein said performance criteria corresponds to a linearity of the broadband amplifier circuit.

3. The circuit according to claim 2 wherein said control signal operates to cause said linearity of the broadband amplifier circuit to vary in direct relationship to said total signal power level of said input signal.

4. The circuit according to claim 1 wherein said performance criteria corresponds to a distortion of the broadband amplifier circuit.

5. The circuit according to claim 4 wherein said control signal operates to cause said distortion of the broadband amplifier circuit to vary in inverse relationship to said total signal power level of said input signal.

6. The circuit according to claim 1 wherein said performance attribute corresponds to a quiescent point of the broadband amplifier circuit.

7. The circuit according to claim 1 wherein said control signal adjusts a bias level supplied to a component of the broadband amplifier circuit.

8. The circuit according to claim 1 further controlling an operation of a second broadband amplifier circuit, said circuit further comprising:
a second power detector connected to provide an output indicative of a total signal power level of an input signal applied to the second broadband amplifier circuit,
said a control unit receiving said output from said second power detector and, in response, providing a control signal to the second broadband amplifier circuit, said control signal supplied to said second broadband amplifier circuit adjusting a performance attribute thereof to dynamically maintain without substantially exceeding minimum allowable performance criteria of said second broadband amplifier circuit.

9. An amplifier comprising:
a broadband amplifier circuit connect to receive and amplify a signal level of an input signal and provide as an output an amplified signal;
a power detector connected to the input of said amplifier circuit and configured to provide an output indicative of a total signal power level of said input signal; and
a control unit receiving said output from said power detector and, in response, providing a control signal to said broadband amplifier circuit, said control signal adjusting a performance attribute of said broadband amplifier circuit to dynamically maintain without substantially exceeding minimum allowable performance criteria.

10. The amplifier according to claim 9 wherein said performance criteria corresponds to a linearity of the broadband amplifier circuit.

11. The amplifier according to claim 10 wherein said control signal operates to cause said linearity of the broadband amplifier circuit to vary in direct relationship to said total signal power level of said input signal.

12. The amplifier according to claim 9 wherein said performance criteria corresponds to a distortion of the broadband amplifier circuit.

13. The amplifier according to claim 12 wherein said control signal operates to cause said distortion of the broadband amplifier circuit to vary in inverse relationship to said total signal power level of said input signal.

14. The amplifier according to claim 9 wherein said performance attribute corresponds to a quiescent point of said broadband amplifier circuit.

15. The amplifier according to claim 9 wherein said control signal adjusts a bias level supplied to an active component of said broadband amplifier circuit.

16. The amplifier according to claim 9 further comprising:
a filter connect to an output of said broadband amplifier circuit and receiving said output signal, said filter attenuating signals having frequencies offset from a center frequency of said filter to provide a filtered signal output;
a second power detector connected to provide an output indicative of a total signal power level of said filtered signal output from said filter; and
a second broadband amplifier circuit connect to said filter and receiving said filtered signal output, said second broadband amplifier circuit configured to amplify said filtered signal output to provide an amplified filtered signal,
said a control unit receiving said output from said second power detector and, in response, providing a control signal to said second broadband amplifier circuit, said control signal supplied to said second broadband amplifier circuit adjusting a performance attribute thereof to dynamically maintain without substantially exceeding minimum allowable performance criteria of said second broadband amplifier circuit.

17. A television tuner comprising:
an input circuit connected to receive a broadband input signal and providing a broadband output signal;
a power detector connected to provide an output indicative of a total signal power level of said broadband input signal, said power detector configured to subtract a gain factor resulting from said input circuit to provide said output indicative of a total input signal power level;
a control unit receiving said output from said power detector and, in response, providing a control signal to the input circuit, said control signal adjusting a performance attribute of said input circuit to dynamically maintain, without substantially exceeding, minimum allowable performance criteria; and
a detector configured to demodulate a signal carried by said broadband output signal to provide a baseband signal.

18. The television tuner according to claim 17 wherein said input circuit comprises a broadband amplifier circuit.

19. A method of controlling an operation of a broadband amplifier circuit, comprising the steps of:
detecting a total signal power level of an input signal applied to the broadband amplifier circuit; and
adjusting a performance attribute of said broadband amplifier circuit in response to said total signal power level to dynamically maintain, without substantially exceeding, minimum allowable performance criteria.

20. The method according to claim 19 wherein said performance criteria corresponds to a linearity of the broadband amplifier circuit.

21. The method according to claim 20 wherein said adjusting step causes said linearity of the broadband amplifier circuit to vary in direct relationship to said total signal power level of said input signal.

22. The method according to claim 19 wherein said performance criteria corresponds to a distortion of the broadband amplifier circuit.

23. The method according to claim 22 wherein said adjusting step causes said distortion of the broadband amplifier circuit to vary in inverse relationship to said total signal power level of said input signal.

24. The method according to claim 19 wherein said adjusting step varies a quiescent point of the broadband amplifier circuit.

25. The method according to claim 19 wherein said adjusting step includes adjusting a bias level supplied to a component of the broadband amplifier circuit.

26. A method of amplifying a broadband signal comprising the steps of:
detecting a total input signal power level of the broadband signal;
determining a value of an amplifying operating parameter necessary to maintain, without substantially exceeding, minimum allowable performance criteria for amplifying the broadband signal; and amplifying said broadband signal utilizing said value of said amplifying operating parameter.

27. The method according to claim 26 wherein said performance criteria corresponds to a linearity of said amplifying step.

28. The method according to claim 27 wherein said determining step causes said linearity of amplifying step to vary in direct relationship to said total signal power level of the broadband signal.

29. The method according to claim 26 wherein said performance criteria corresponds to a distortion of said amplifying step.

30. The method according to claim 29 wherein said determining step causes said distortion of amplifying step to vary in inverse relationship to said total signal power level of the broadband signal.

* * * * *